United States Patent
Yim et al.

(10) Patent No.: US 8,854,578 B2
(45) Date of Patent: Oct. 7, 2014

(54) DISPLAY APPARATUS AND METHOD OF OPERATING THE SAME

(75) Inventors: Sang-Hoon Yim, Yongin (KR); Young-Woo Song, Yongin (KR); Jin-Koo Chung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 242 days.

(21) Appl. No.: 13/137,958

(22) Filed: Sep. 22, 2011

(65) Prior Publication Data

US 2012/0268696 A1   Oct. 25, 2012

(30) Foreign Application Priority Data

Apr. 25, 2011   (KR) .................. 10-2011-0038440

(51) Int. Cl.
| | | |
|---|---|---|
| *G02F 1/1335* | (2006.01) | |
| *H01J 1/62* | (2006.01) | |
| *H01J 63/04* | (2006.01) | |
| *H01L 51/52* | (2006.01) | |
| *H01L 27/32* | (2006.01) | |
| *G09G 3/32* | (2006.01) | |

(52) U.S. Cl.
CPC ............ *G09G 3/32* (2013.01); *G09G 2300/046* (2013.01); *H01L 51/5281* (2013.01); *H01L 27/326* (2013.01); *H01L 27/3232* (2013.01)
USPC ............................ 349/104; 313/504; 313/506

(58) Field of Classification Search
USPC .................................................. 313/504, 506
See application file for complete search history.

(56) References Cited

U.S. PATENT DOCUMENTS

| | | | |
|---|---|---|---|
| 5,686,979 A | 11/1997 | Weber et al. | |
| 2005/0140813 A1* | 6/2005 | Wani ..................... 348/333.12 | |
| 2005/0185278 A1 | 8/2005 | Horsten et al. | |
| 2007/0090751 A1* | 4/2007 | Cok et al. ...................... 313/501 | |
| 2009/0233514 A1* | 9/2009 | Lee et al. ........................ 445/25 | |

(Continued)

FOREIGN PATENT DOCUMENTS

| | | |
|---|---|---|
| JP | 2000-195673 A | 7/2000 |
| JP | 2011-81966 A | 4/2011 |

(Continued)

OTHER PUBLICATIONS

Song et al., "LTPS-based Transparent AM OLED", SID 10 Digest, pp. 144-147.*

(Continued)

*Primary Examiner* — Bumsuk Won
*Assistant Examiner* — Ryan Crockett
(74) *Attorney, Agent, or Firm* — Lee & Morse, P.C.

(57) ABSTRACT

A display apparatus may include a first substrate defined by a pixel region and a transmitting region adjacent to the pixel region, the pixel region emitting light in a first direction and the transmitting region transmitting external light; a second substrate that faces the first substrate and seals pixels defined on the first substrate; an optical filter arranged on a first side of the display apparatus through which light is emitted, the optical filter being configured to transmit circularly polarized light that rotates in a predetermined direction; and an optical reflectance conversion device arranged on a second side of the display apparatus, opposite the first side, the optical reflectance conversion device being configured to change a reflectance of the external light according to modes of operation of the display apparatus.

22 Claims, 8 Drawing Sheets

(56) References Cited

U.S. PATENT DOCUMENTS

2009/0244413 A1 10/2009 Ishikawa et al.
2010/0253671 A1 10/2010 Perry et al.
2011/0079815 A1* 4/2011 Yamada et al. ................ 257/99

FOREIGN PATENT DOCUMENTS

| KR | 10 2004-0094811 A | 11/2004 |
| KR | 10 2005-0070872 A | 7/2005 |
| KR | 10 2006-0020110 A | 3/2006 |
| WO | WO 2005/024501 * | 3/2005 |
| WO | WO 2005-024501 A1 | 3/2005 |
| WO | WO 2011-044435 A1 | 4/2011 |

OTHER PUBLICATIONS

Extended European Search Report for EP 11192002.1 dated May 5, 2012 (Yim et al.).
Korean Office Action Dated Jan. 17, 2014.

* cited by examiner

DISPLAY APPARATUS AND METHOD OF OPERATING THE SAME

CROSS-REFERENCE TO RELATED PATENT APPLICATION

This application claims the benefit of Korean Patent Application No. 10-2011-0038440, filed on Apr. 25, 2011, in the Korean Intellectual Property Office, the disclosure of which is incorporated herein in its entirety by reference.

BACKGROUND

1. Field

Embodiments relate to a display apparatus. More particularly, embodiments relate to a display apparatus that can change optical transmittance according to modes, and a method of operating the same.

2. Description of the Related Art

Applications of organic light-emitting display apparatuses have increased from personal portable devices, i.e., MP3 players or mobile phones, to television sets due to wide viewing angles, high contrast, short response times, and low power consumption. Organic light-emitting display apparatuses have an emissive characteristic. Thus, unlike a liquid crystal display apparatus, organic light-emitting display apparatuses do not require an additional light source. Accordingly, the thickness and weight of organic light-emitting devices may be reduced. Also, the organic light-emitting display apparatuses may be formed in transparent display apparatuses by forming thin-film transistors and organic light-emitting devices therein of a transparent type, and by forming a transparent region (or transparent window) separate from a pixel region.

SUMMARY

According to an embodiment, a display apparatus may include a first substrate defined by a pixel region and a transmitting region adjacent to the pixel region, the pixel region emitting light in a first direction and the transmitting region transmitting external light; a second substrate that faces the first substrate and seals pixels defined on the first substrate; an optical filter arranged on a first side of the display apparatus through which light is emitted, the optical filter being configured to transmit circularly polarized light that rotates in a predetermined direction; and an optical reflectance conversion device arranged on a second side of the display apparatus, opposite the first side, the optical reflectance conversion device being configured to change a reflectance of the external light according to modes of operation of the display apparatus.

The pixel may include a pixel circuit unit in the pixel region on the first substrate, the pixel circuit unit including at least one thin-film transistor; a first insulating film covers at least the pixel circuit unit; a first electrode on the first insulating film electrically connected to the pixel circuit unit, the first electrode located in the pixel region and not overlapping the pixel circuit unit, and the first electrode is formed of a transparent conductive material; a second electrode configured to reflect light to be emitted in a direction towards the first electrode, the second electrode facing the first electrode and located in the pixel region; and an organic film between the first electrode and the second electrode and includes a light-emitting layer.

The optical filter may be on an outer side of the first substrate and the optical reflectance conversion device may be on an outer side of the second substrate.

The pixel may include the transmitting region and a plurality of the pixel regions separated from each other by interposing the transmitting region therebetween.

The display apparatus may further include a second insulating film that does not cover some of the first electrode, the second insulating film located at least on a pixel region portion of the pixel region and on the transmitting region on the first insulating film, wherein the organic film is located on a first electrode portion of the first electrode that is not covered by the second insulating film.

The pixel may include a pixel circuit unit located in the pixel region on the first substrate, the pixel circuit unit including at least one thin-film transistor; a first insulating film to cover at least the pixel circuit unit; a first electrode on the first insulating film and electrically connected to the pixel circuit unit, the first electrode located in the pixel region and overlapping with the pixel circuit unit, and the first electrode includes a conductive material reflection film; a second electrode facing the first electrode and configured to reflect light to be emitted in a direction opposite to the first electrode; and an organic film between the first electrode and the second electrode, the organic film including a light-emitting layer.

The optical filter may be on an outer side of the second substrate and the optical reflectance conversion device may be on an outer side of the first substrate.

The pixel may include the transmitting region and the plurality of the pixel regions separated from each other by interposing the transmitting region.

The display apparatus may further include a second insulating film that does not cover some of the first electrode, the second insulating film located at least on a portion of the pixel region and on the transmitting region on the first insulating film, wherein the organic film is located on a first electrode portion of the first electrode that is not covered by the second insulating film.

The optical filter may be a combination of a linear polarizing filter and a Lamda/4 retarder or a circularly polarizing filter.

The optical reflectance conversion device may have a limitation that a sum of the reflectance of the external light and the transmittance of the external light is one.

The optical reflectance conversion device may be a liquid crystal device or an electro-chromic device.

The electro-chromic device may include: a pair of transparent electrode layers to which power is applied; and an electro-chromic material layer between the transparent electrode layers and including an electro-chromic material, a phase of which is changed by a power applied to the transparent electrode layers to control the optical reflectance of the display apparatus.

In a first mode, the optical reflectance conversion device may transmit the external light that enters through the optical filter and the display device.

In a second mode, the optical reflectance conversion device may reflect the external light entering through the optical filter and the display device.

In the second mode, the external light that is reflected by the optical reflectance conversion device may not be re-transmitted through the optical filter.

In a third mode, the optical reflectance conversion device may reflect an external light portion of the external light entering through the optical filter and the display device and transmits the other external light portion of the external light.

In the third mode, the external light portion of the external light that is reflected by the optical reflectance conversion device may not be re-transmitted through the optical filter.

According to another embodiment, a method of operating the display apparatus may include a display, an optical filter arranged on a first side of the display apparatus to which light is emitted, the optical filter being configured to transmit circularly polarized light that rotates in a predetermined direction; and an optical reflectance conversion device arranged on a second side of the display apparatus, opposite the first side, the optical reflectance conversion device being configured to change a reflectance of the external light according to modes of operation of the display apparatus, the method including realizing a first mode, a second mode, and a third mode by controlling the reflectance of the external light that is transmitted through the optical filter and the display device by applying different powers to the optical reflectance conversion device.

Realizing the first mode may include: applying a first power to the optical reflectance conversion device; displaying an image in the first direction in the display device; and transmitting the external light in a second direction, opposite the first direction, through the optical filter, the display device, and the optical reflectance conversion device.

Realizing the second mode may include: applying a second power to the optical reflectance conversion device; displaying an image in the first direction in the display device; transmitting the external light in a second direction, opposite the first direction, through the optical filter and the display device; reflecting the external light transmitted through the optical filter and the display device in the first direction by the optical reflectance conversion device; and transmitting reflected external light through the display device, but not through the optical filter.

Realizing the third mode may include: applying a third power to the optical reflectance conversion device; displaying an image in the first direction in the display device; transmitting the external light in a second direction, opposite the first direction, through the optical filter and the display device; reflecting a first portion of the external light transmitted through the optical filter and the display device in the first direction by the optical reflectance conversion device and transmitting a second portion of the external light in the second direction through the optical reflectance conversion device; and transmitting reflected external light through the display device, but not through the optical filter.

BRIEF DESCRIPTION OF THE DRAWINGS

The above and other features will become more apparent by describing in detail exemplary embodiments thereof with reference to the attached drawings in which.

DETAILED DESCRIPTION

Figure 1:
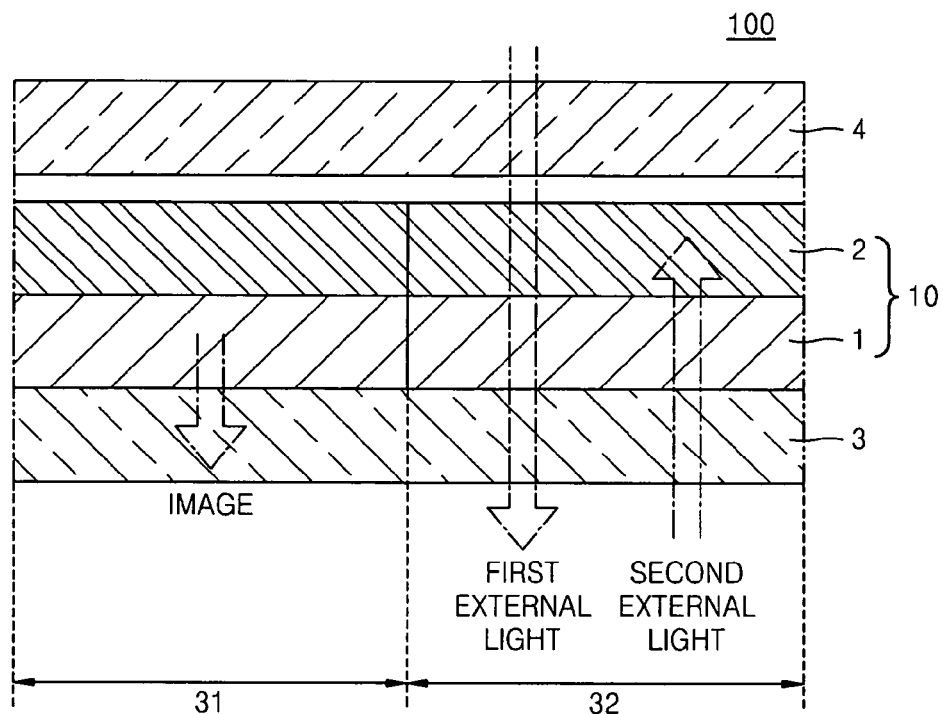
FIG. 1 is a schematic cross-sectional view of a display apparatus according to an embodiment.

Example embodiments will now be described more fully hereinafter with reference to the accompanying drawings; however, they may be embodied in different forms and should not be construed as limited to the embodiments set forth herein.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Present embodiments will now be described more fully with reference to the accompanying drawings in which exemplary embodiments are shown. Throughout the drawings, like reference numerals have been used to designate like elements.

FIG. 1 is a schematic cross-sectional view of a display apparatus 100 according to an embodiment.

Referring to FIG. 1, the display apparatus 100 includes an optical filter 3 and an optical reflectance conversion device 4 on a transparent display device 10 through which external light may be transmitted.

The display device 10 may be a bottom emission type organic light-emitting display device and may include a first substrate 1, a display unit formed on the first substrate 1, and a second substrate 2 that seals the display unit. The display unit may be defined to a plurality of pixels, and the pixels may include a pixel region 31 through which light is emitted in a direction towards the first substrate 1, and a transmitting region 32 that is adjacent to the pixel region 31 to transmit external light.

The optical filter 3 is disposed on an outer side of the first substrate 1 through which the display device 10 emits light. An aspect of the optical filter 3 is that the optical filter 3 allows circularly polarized light that rotates in a predetermined direction to transmit therethrough. Accordingly, the optical filter 3 may be a combination of a linearly polarizing light filter and a Lamda/4 retarder which is a phase change device or a circularly polarizing light filter.

The optical reflectance conversion device 4 is disposed on an outer side of the second substrate 2 through which the display device 10 does not emit light. The optical reflectance conversion device 4 changes the reflectance of external light according to modes. The optical reflectance conversion device 4 may be a liquid crystal device that can change optical transmittance or reflectance by changing the arrangement of liquid crystals according to an application of an electric field or an electro-chromic device that can change optical transmittance or reflectance by changing the state of an electro-chromic material according to an application of power.

The optical reflectance conversion device 4 has a limitation that the sum of reflectance and transmittance always satisfy 1 (or 100%). A contrast ratio of the display apparatus 100 is expressed as the following equation 1, and the contrast ratio of the display apparatus 100 may be simply controlled by using the optical reflectance conversion device 4. If there is no limitation described above, the contrast ratio of the display apparatus 100 must be controlled by using the two variables, that is, reflectance and transmittance. However, since the optical reflectance conversion device 4 has the limitation as described above, the contrast ratio of the display apparatus 100 may be simply controlled by controlling one of the reflectance and transmittance.

$$\text{contrast ratio} \propto \frac{1}{\text{reflectance} \times (1 - \text{transmittance})} \quad \text{[Equation 1]}$$

According to the current embodiment, when the optical reflectance conversion device 4 is in an optical transmitting mode, a user who is positioned on a side where an image is realized may view an image displayed on the outer side of the second substrate 2 through a first external light transmitted towards the outer side of the first substrate 1. Also, a second external light may not effect on the contrast ratio of the display apparatus 100 since the second external light is transmitted through the display apparatus 100. Here, the first external light is transmitted in the same direction as the image, and the second external light is transmitted in a direction opposite to the first external light.

When the optical reflectance conversion device 4 is in an optical reflection mode, the first external light may not be transmitted through the display apparatus 100. However, in this mode, the second external light that is transmitted towards the outer side of the second substrate 2 from the outer side of the first substrate 1 is reflected by the optical reflectance conversion device 4, and thus, is transmitted towards the outer side of the first substrate 1, thereby reducing the contrast ratio of the display apparatus 100. According to the current embodiment, in order to address the above problem, the reduction of the contrast ratio of the display apparatus 100 is prevented by disposing the optical filter 3. The operation of the display apparatus 100 according to present embodiments will be described in detail below with reference to FIGS. 9 through 11.

Figure 2:
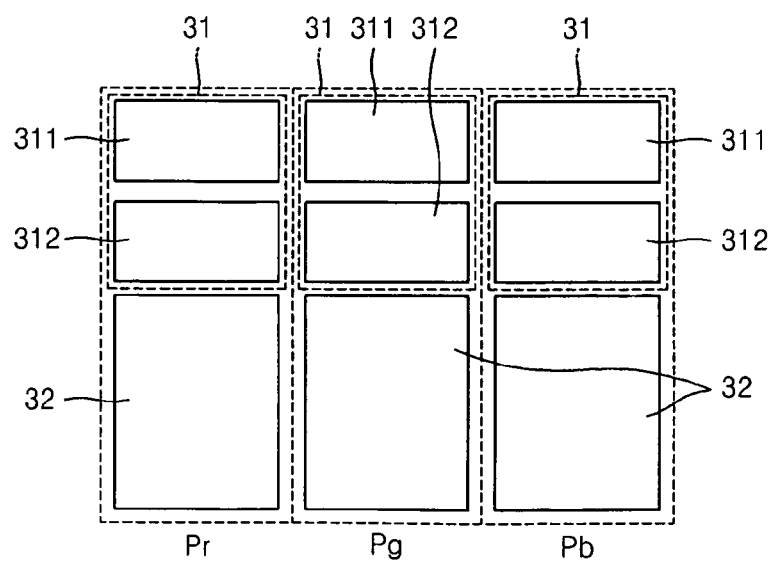
FIG. 2 is a plan view showing a pixel included in the display device of FIG. 1, according to an embodiment.
Figure 3:
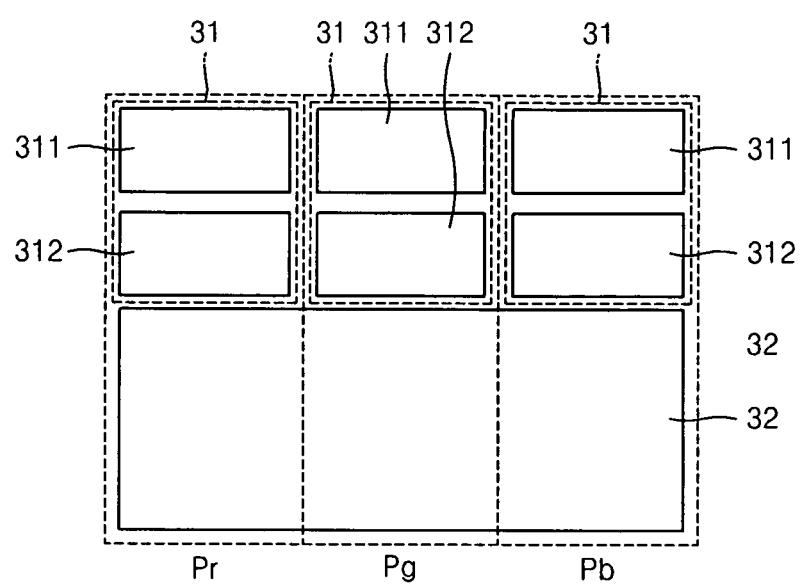
FIG. 3 is a plan view showing a pixel included in the display device of FIG. 1, according to another embodiment.

FIG. 2 is a plan view showing a pixel included in the display device 10 of FIG. 1, according to an embodiment. FIG. 3 is a plan view showing another example of a pixel included in the display device 10 of FIG. 1, according to another embodiment.

A pixel may include a plurality of sub-pixels, for example, red, green, and blue sub-pixels Pr, Pg, and Pb.

Each of the red, green, and blue sub-pixels Pr, Pg, and Pb includes the pixel region 31 and the transmitting region 32. Each of the pixel regions 31 includes a pixel circuit unit 311 and a light-emitting unit 312, wherein the pixel circuit unit 311 and the light-emitting unit 312 are disposed to adjacent to each other not to overlap. This is because when the light-emitting unit 312 emits light towards the first substrate 1, i.e., a bottom emission type display apparatus, the light path may not be interrupted by the pixel circuit unit 311.

The transmitting region 32 that transmits external light is disposed adjacent to the pixel region 31.

As shown in FIG. 2, each of the transmitting regions 32 is independently formed in the red, green, and blue sub-pixels Pr, Pg, and Pb. As shown in FIG. 3, each of the transmitting regions 32 may be connected to each other throughout the red, green, and blue sub-pixels Pr, Pg, and Pb. In other words, taking the display unit as a whole, a pixel may include a plurality of pixel regions 31 separated from each other interposing common transmitting regions 32 therebetween. In the case of the transmitting region 32 of FIG. 3, there is an effect of increasing an area of the transmitting region 32, and thus, the overall transmittance of the display unit may be increased.

In FIG. 3, the red, green, and blue sub-pixels Pr, Pg, and Pb in the transmitting region 32 are depicted as connected to each other. However, present embodiments are not limited thereto, and the transmitting regions 32 of any two of the red, green, and blue sub-pixels Pr, Pg, and Pb may be connected to each other.

Figure 4:
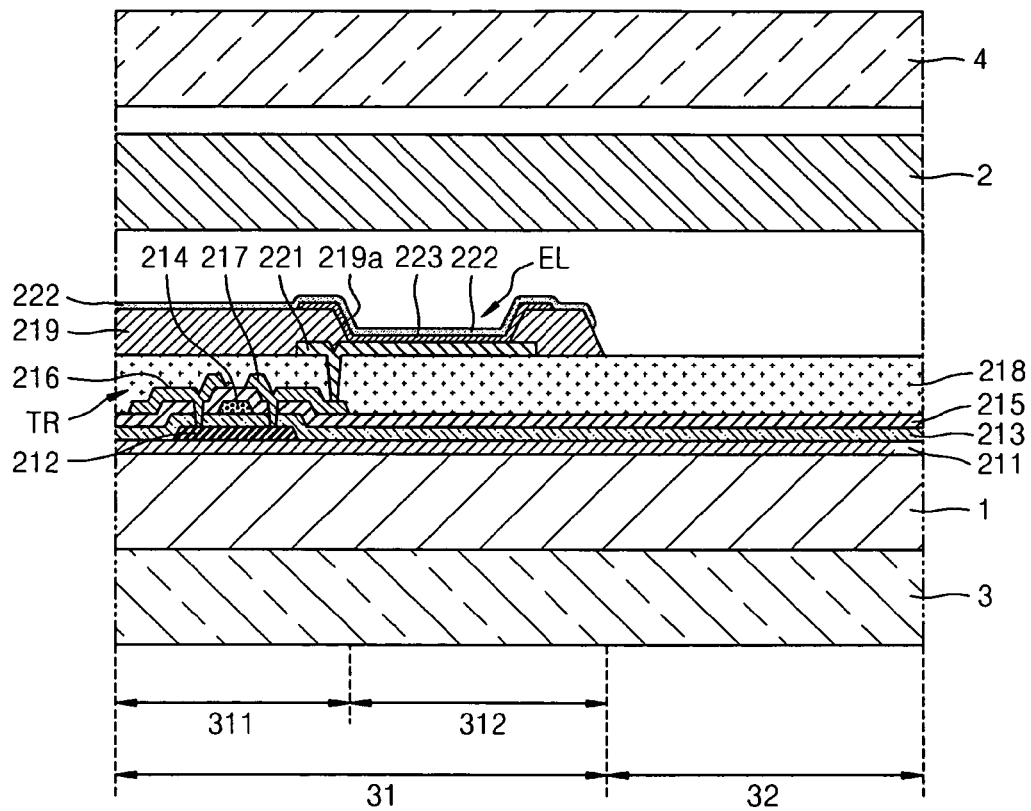
FIG. 4 is a cross-sectional view of one of a plurality of sub-pixels depicted in FIGS. 2 and 3, according to an embodiment.

FIG. 4 is a cross-sectional view of one of the red, green, and blue sub-pixels Pr, Pg, and Pb depicted in FIGS. 2 and 3.

Referring to FIG. 4, a thin-film transistor TR is disposed in the pixel circuit unit 311. However, the pixel circuit unit 311 may not necessarily include one thin-film transistor TR but may include a pixel circuit that includes the thin-film transistor TR. The pixel circuit may further include a plurality of thin-film transistors and storage capacitors, and may further include a scan line, a data line, and a Vdd line connected to the thin-film transistors and the storage capacitors.

An organic light-emitting device EL, which is a light-emitting device, is disposed in the light-emitting unit 312. The organic light-emitting device EL is electrically connected to the thin-film transistor TR of the pixel circuit unit 311.

First, a buffer film 211 is formed on the first substrate 1, and a pixel circuit having a thin-film transistor TR is formed on the buffer film 211.

A semiconductor active layer 212 is formed on the buffer film 211.

The buffer film 211 prevents the penetration of impurity elements and planarizes a surface. The buffer film 211 may be formed of various materials, for example, an inorganic material selected from the group consisting of silicon oxide, silicon nitride, silicon oxynitride, aluminium oxide, aluminium nitride, titanium oxide, and titanium nitride or an organic material selected from the group consisting of polyimide, polyester, and acryl, or stack layers of these materials. The buffer film 211 is not an essential constituent element, and thus, may not be included if it is unnecessary.

The semiconductor active layer 212 may be formed of polycrystal silicon but is not limited thereto. The semiconductor active layer 212 may be formed of an oxide semiconductor oxide, i.e., a $[(In_2O_3)a(Ga_2O_3)b(ZnO)c]$ (G-I-Z-O) layer (where a, b, and c are real numbers that respectively satisfy a≥0, b≥0, c>0). When the semiconductor active layer 212 is formed of an oxide semiconductor, optical transmittance of the pixel circuit unit 311 in the pixel region 31 may be increased. Accordingly, the external light transmittance of the entire display unit may be increased.

A gate insulating film 213, covering the semiconductor active layer 212, is formed on the buffer film 211, and a gate electrode 214 is formed on the gate insulating film 213.

An interlayer insulating film 215, covering the gate electrode 214, is formed on the gate insulating film 213, and a source electrode 216 and a drain electrode 217 are formed on the interlayer insulating film 215. The source electrode 216 and the drain electrode 217 are connected to the semiconductor active layer 212 through contact holes, respectively.

The structure of the thin-film transistor TR is not limited thereto. That is, the thin-film transistor TR may have various types of structures.

A passivation film 218 is formed to cover the thin-film transistor TR. The passivation film 218 may be a single layer or a multi-layer insulating film having an upper surface thereof that is planarized. The passivation film 218 may be formed of an inorganic material or organic material. The passivation film 218 is formed to cover both of the pixel region 31 and the transmitting region 32.

As shown in FIG. 4, a first electrode 221 of the organic light-emitting device EL electrically connected to the thin-film transistor TR is formed on the passivation film 218. The first electrode 221 is formed as an island type electrode independently in each of the red, green, and blue sub-pixels Pr, Pg, and Pb. The first electrode 221 is positioned in the light-emitting unit 312 of the pixel region 31, and is disposed not to overlap the pixel circuit unit 311.

A pixel-defining film 219 is formed on the passivation film 218 using an organic and/or inorganic insulating material.

The pixel-defining film 219 includes a first opening 219a to cover edges and to expose a central region of the first electrode 221. At this point, the pixel-defining film 219 may be formed to cover the pixel region 31. However, the pixel-defining film 219 may not necessarily cover the whole pixel region 31, but may cover at least a portion of the pixel region 31, i.e., edges of the first electrode 221. The pixel-defining film 219 is disposed not in the transmitting region 32. Since the pixel-defining film 219 is not disposed in the transmitting region 32, the optical transmission efficiency of external light in the transmitting region 32 may further be increased.

An organic film 223 and a second electrode 222 are sequentially formed on the first electrode 221 exposed through the first opening 219a. The second electrode 222 faces the first electrode 221, covers the organic film 223 and the pixel-defining film 219, and is located in the pixel region 31. The second electrode 222 is not disposed in the transmitting region 32.

The organic film 223 may be a low molecular weight organic film or a polymer organic film. When the organic film 233 is a low molecular weight organic film, the organic film 223 may be formed in a single layer or a composite layer structure by stacking a hole injection layer (HIL), a hole transport layer (HTL), an emission layer (EML), an electron transport layer (ETL), an electron injection layer (EIL) and may be formed of various materials including copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film may be formed by using an evaporation method. At this point, the HIL, the HTL, the ETL, and the EIL are common layers, and thus, may be commonly applied to the red, green, and blue sub-pixels Pr, Pg, and Pb.

The first electrode 221 may perform as an anode electrode, and the second electrode 222 may performed as a cathode electrode. However, the polarities of the first electrode 221 and the second electrode 222 may be reversed.

According to the current embodiment, the first electrode 221 may be a transparent electrode, and the second electrode 222 may be a reflection electrode. The first electrode 221 may be formed of a transparent conductive material, i.e., a material of ITO, IZO, ZnO, and $In_2O_3$. The second electrode 222 may be formed of a metal of Ag, Mg, Al, Pt, Pd, Au, Ni, Nd, Ir, Cr, Li, and Ca. Accordingly, the organic light-emitting device EL is a bottom emission type organic light-emitting device that produces an image in a direction towards the first electrode 221. In this case, the second electrode 222 may be formed to have a thickness sufficient enough to prevent an entire voltage drop of the display unit, and thus, may be sufficient to be applied to a large-area display apparatus 100.

Figure 5:
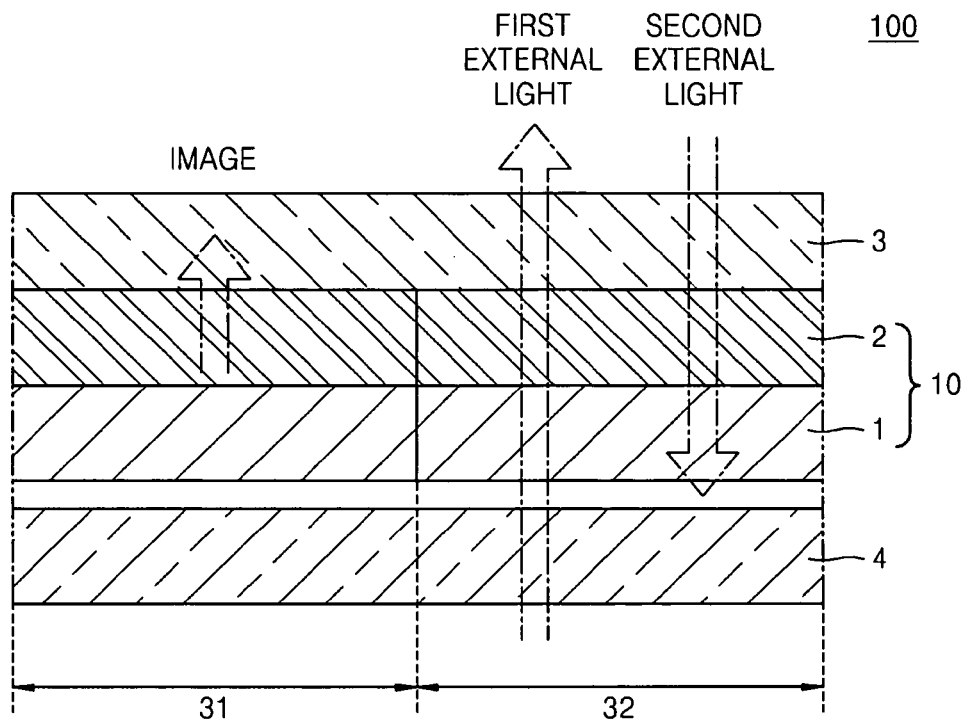
FIG. 5 is a schematic cross-sectional view of a display apparatus according to another embodiment.

FIG. 5 is a schematic cross-sectional view of a display apparatus 100 according to another embodiment.

The display apparatus 100 in FIG. 5, unlike in the display apparatus 100 of FIG. 1, may be a top emission type organic light-emitting device in which the display device 10 is a top emission type device. Accordingly, the optical filter 3 is disposed on an outer side of the second substrate 2 through which the display device 10 emits light. The optical reflectance conversion device 4 is disposed on an outer side of the first substrate 1 through which the display device 10 does not emit light. The rest of the constituent elements of FIG. 5 correspond to the constituent elements of FIG. 1 and have substantially the same or similar functions to the constituent elements described in the previous embodiment of FIG. 1. Thus, the description thereof will not be repeated.

As depicted in FIG. 5, according to the current embodiment, when the optical reflectance conversion device 4 is in an optical transmitting mode, a user at a side where an image is realized may view the image displayed on the outer side of the first substrate 1 from a first external light that is transmitted in a direction towards the outer side of the second substrate 2. Also, the second external light does not effect the contrast ratio since the second external light is transmitted through the display apparatus 100.

When the optical reflectance conversion device 4 is in an optical reflection mode, the first external light may not be transmitted through the display apparatus 100. However, in this mode, there is a problem in that the second external light transmitted towards the outer side of the first substrate 1 from the outer side of the second substrate 2 is reflected by the optical reflectance conversion device 4, and thus, is emitted towards the outer side of the second substrate 2, thereby reducing the contrast ratio of the display apparatus 100. It is an aspect of the current embodiment that, in order to address the above problem, the optical filter 3 is disposed to reduce the reduction of the contrast ratio. The operation of the display apparatus 100 according to the current embodiment will be described in detail below with reference to FIGS. 9 through 11.

Figure 6:
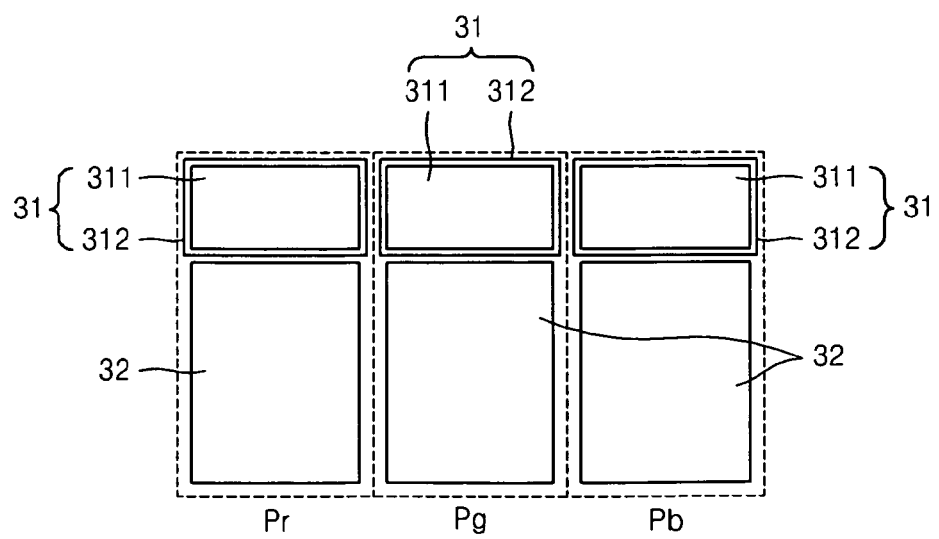
FIG. 6 is a plan view showing a pixel included in the display device of FIG. 5, according to another embodiment.
Figure 7:
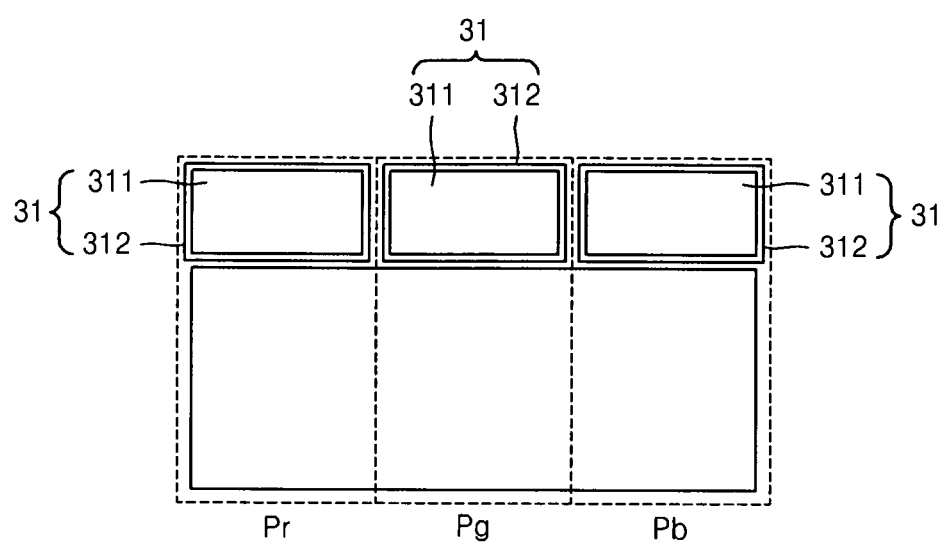
FIG. 7 is a plan view showing a pixel included in the display device of FIG. 5, according to another embodiment.

FIG. 6 is a plan view showing a pixel included in the display device 10 of FIG. 5, according to another embodiment. FIG. 7 is a plan view showing a pixel included in the display device 10 of FIG. 5, according to another embodiment.

In the pixels depicted in FIGS. 6 and 7, unlike the pixels in FIGS. 2 and 3, the pixel circuit unit 311 and the light-emitting unit 312 included in the pixel region 31 overlap with each other. Since the light-emitting unit 312 emits light in a direction towards the second substrate 2, that is, the light-emitting unit 312 is a top emission type display apparatus, the overlapping of the pixel circuit unit 311 and the light-emitting unit 312 may not affect the contrast ratio of the display apparatus 100. In addition, since the light-emitting unit 312 covers the pixel circuit unit 311 that includes a pixel circuit, optical interference by pixel circuit may be avoided. The rest of the constituent elements of FIGS. 6 and 7 correspond to the constituent elements of FIGS. 2 and 3 and have substantially the same or similar functions to the constituent elements described in the previous embodiments of FIGS. 2 and 3. Thus, the description thereof will not be repeated.

As shown in FIG. 6, each of the transmitting regions 32 may be independently formed in the red, green, and blue sub-pixels Pr, Pg, and Pb. Also, as shown in FIG. 7, may be connected to each other across the red, green, and blue sub-pixels Pr, Pg, and Pb.

Figure 8:
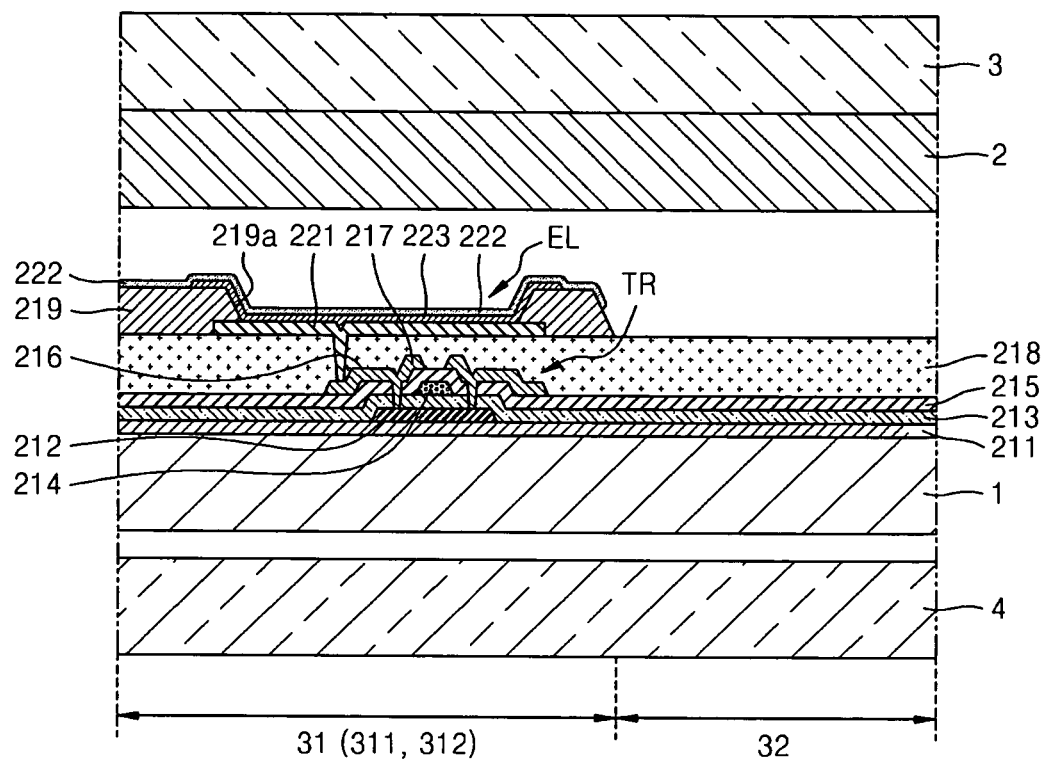
FIG. 8 is a cross-sectional view of one of a plurality of sub-pixels depicted in FIGS. 6 and 7, according to another embodiment.

FIG. 8 is a cross-sectional view of one of the red, green, and blue sub-pixels Pr, Pg, and Pb depicted in FIGS. 6 and 7, according to another embodiment.

Referring to FIG. 8, a thin-film transistor TR is disposed in the pixel circuit unit 311 and an organic light-emitting device EL, which is a light-emitting device, is disposed in the light-emitting unit 312.

The buffer film 211 is formed on the first substrate 1, a semiconductor active layer 212 is formed on the buffer film 211, and the gate insulating film 213, the gate electrode 214, and the interlayer insulating film 215 are formed on the semiconductor active layer 212. The source electrode 216 and the drain electrode 217 are formed on the interlayer insulating film 215. A passivation film 218, which is a kind of insulating film, is formed to cover the thin-film transistor TR. The passivation film 218 covers both the pixel region 31 and the transmitting region 32.

As shown in FIG. 8, the first electrode 221 of the organic light-emitting device EL that is electrically connected to the thin-film transistor TR is formed on the passivation film 218. The first electrode 221 is disposed in the light-emitting unit 312 of the pixel region 31, and covers the pixel circuit unit 311 by overlapping with the pixel circuit unit 311.

The pixel-defining film 219 is formed on the passivation film 218 using an organic and/or inorganic insulating material.

The pixel-defining film 219 includes the first opening 219a to cover edges of the first electrode 221 and to expose a central region of the first electrode 221. At this point, the pixel-defining film 219 may be formed to cover the pixel region 31. However, the pixel-defining film 219 may not necessarily cover the whole pixel region 31, but may cover at least a portion of the pixel region 31, i.e., the edges of the first electrode 221. The pixel-defining film 219 is disposed not in the transmitting region 32. Since the pixel-defining film 219 is not disposed in the transmitting region 32, the optical transmission efficiency of external light in the transmitting region 32 may be increased.

The organic film 223 and the second electrode 222 are sequentially stacked on the first electrode 221 exposed through the first opening 219a.

According to the current embodiment, in the sub-pixel depicted in FIG. 8, the first electrode 221 may be formed in a stack structure of a transparent conductor and a reflection film, and the second electrode 222 may be a semi-reflection and semi-transmission electrode. Here, the transparent conductor may be formed of a material having a high work function, for example, may be one of ITO, IZO, ZnO, and $In_2O_3$. The reflection film may be formed of at least one metal of Ag, Mg, Al, Pt, Pd, Au, Ni, Nd, Ir, Cr, Li, Ca, Mo, and an alloy of these metals. The first electrode 221 is formed in the pixel region 31.

The second electrode 222 may be formed of one metal of Ag, Mg, Al, Pt, Pd, Au, Ni, Nd, Ir, Cr, Li, Ca, Mo, and an alloy of these metals. The second electrode 222 may be formed as a thin film having a thickness in a range from about 100 Å(angstrom) to 300 Å(angstrom) to have a high transmittance. Accordingly, the organic light-emitting device EL is a top emission type organic light-emitting device that produces an image in a direction towards the second electrode 222.

Figure 9:
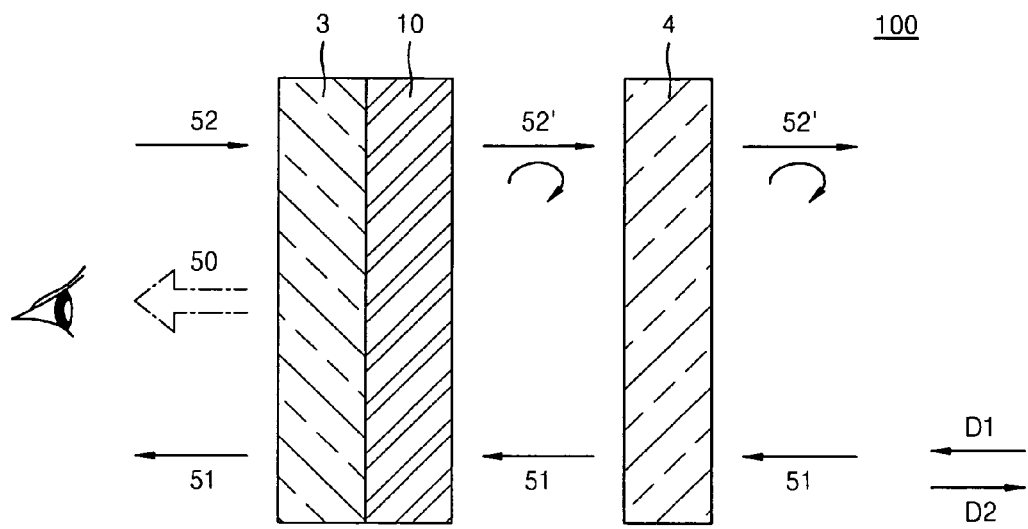
FIGS. 9 through 11 are schematic drawings showing methods of operating in each mode of a display apparatus according to an embodiment.
Figure 10:
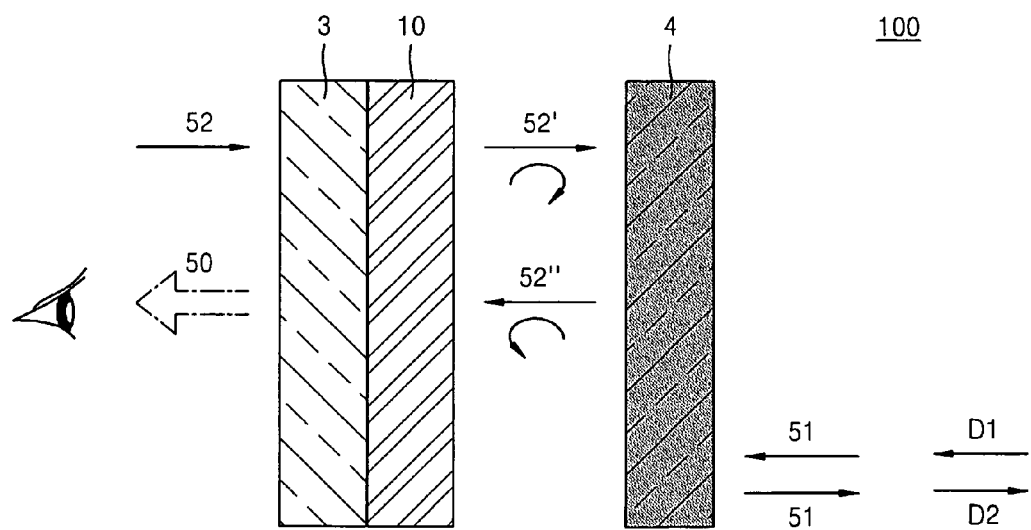
Figure 11:
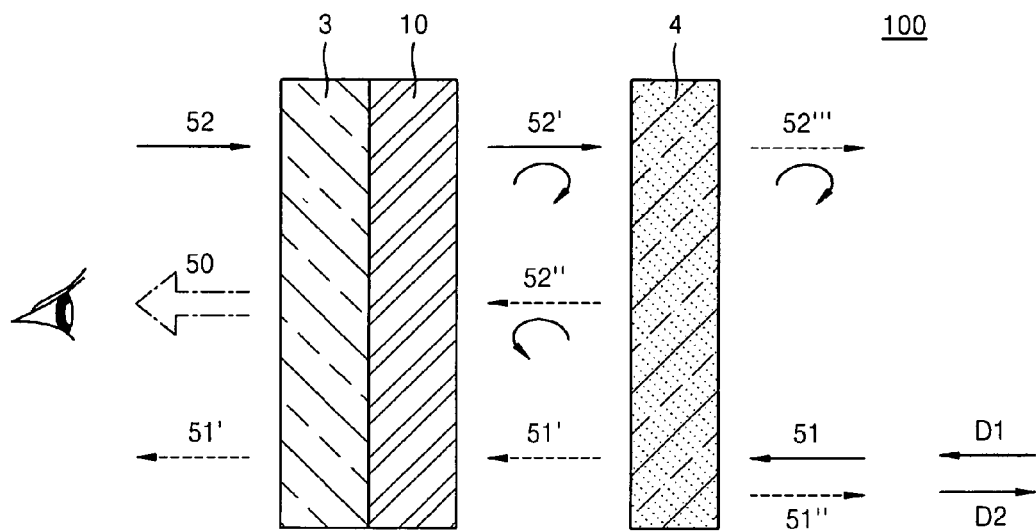

FIGS. 9 through 11 are schematic drawings showing methods of operating in each mode of the display apparatus 100 according to an embodiment.

The display apparatus 100 operates in three modes. Each of the modes is distinguished according to the optical reflectance of the optical reflectance conversion device 4, and the optical reflectance is determined according to a power applied to the optical reflectance conversion device 4.

Referring to FIG. 9, the first mode is a case when the optical reflectance conversion device 4 transmits all light. In the first mode, a first power is applied to the optical reflectance conversion device 4.

An image 50 is emitted in a D1 direction in the display device 10. At this point, a user located in a direction in which the image 50 is emitted may view an object located on an outer side of the optical reflectance conversion device 4 due to the first external light 51 that has transmitted through the display apparatus 100 in the D1 direction.

The second external light 52 may be transmitted in a D2 direction through the optical filter 3, the display device 10, and the transparent optical reflectance conversion device 4. However, the second external light 52' that is transmitted through the optical filter 3 becomes a circularly polarized light that rotates in a predetermined direction.

FIG. 10 shows a second mode in which the optical reflectance conversion device 4 does not transmit but reflects light. In the second mode, a second power different from the first power is applied to the optical reflectance conversion device 4.

The image 50 is emitted in the D1 direction in the display device 10. At this point, the user located in the direction in which the image is emitted may not view an object located on the outer side of the optical reflectance conversion device 4. This is because the first external light 51 is not transmitted in the D1 direction through the display apparatus 100 since the optical reflectance conversion device 4 reflects all light.

Meanwhile, the second external light may be transmitted through the optical filter 3 and the display device 10 in the D2 direction. Also, the second external light 52' that is transmitted through the optical filter 3 becomes a circularly polarized light that rotates in a predetermined direction. Also, all of the second external light 52' is reflected in the D1 direction by the optical reflectance conversion device 4 and becomes a second external light 52". In this way, the second external light 52" reflected by the optical reflectance conversion device 4 has a converted rotational direction, and thus, becomes a circularly polarized light that rotates in a direction different from the second external light 52'. Accordingly, the second external light 52" may be transmitted through the transparent display device 10 but may not be transmitted through the optical filter 3.

According to the current embodiment, since the second external light 52" that is reflected by the optical reflectance conversion device 4 may not be transmitted through the optical filter 3, the second external light 52" may not reach the user located on a side where the image 50 is emitted. Accordingly, the external light reflection is removed, and thus, a maximum contrast ratio of the display apparatus 100 is realized. When the display apparatus 100 described above is used, a black color may be clearly realized in a bright environment without the reflection of external light.

FIG. 11 shows a third mode in which the optical reflectance conversion device 4 transmits a portion of light, and simultaneously, reflects the remaining portion of light. Here, the optical reflectance conversion device 4 has a limitation that the sum of reflectance and transmittance is 1. In the third mode, a third power different from the first and second powers is applied to the optical reflectance conversion device 4.

The image 50 is emitted in the D1 direction in the display device 10. At this point, the user located in the direction in which the image 50 is emitted may view to some degree an object located on the outer side of the optical reflectance conversion device 4. This is because the optical reflectance conversion device 4 transmits a portion of the first external light 51 and reflects the remaining portion of light. A first external light 51' that has transmitted through the optical reflectance conversion device 4 reaches the user by progressing in the D1 direction through the display device 10 and the optical filter 3. The first external light 51" is reflected by the optical reflectance conversion device 4, and the sum of the reflectance and the transmittance of the optical reflectance conversion device 4 must be 1 (or 100%).

The second external light 52 may be transmitted through the optical filter 3 and the display device 10 in the D2 direction. The second external light 52' that is transmitted through the optical filter 3 becomes a circularly polarized light that rotates in a predetermined direction. A portion of the second external light 52' is reflected in the D1 direction by the optical reflectance conversion device 4 and becomes a second external light 52". The remaining portion of the second external light 52' becomes a second external light 52' that has transmitted through the optical reflectance conversion device 4 in the D2 direction. Here, since the sum of the reflectance and transmittance of the optical reflectance conversion device 4 is 1 (or 100%), when the second external light 52" and the second external light 52' are added, the sum may be the second external light 52'. Here, the second external light 52" reflected by the optical reflectance conversion device 4 has a converted rotational direction, and thus, is a circularly polarized light that rotates in a direction different from that of the second external light 52'. Accordingly, the second external light 52" may be transmitted through the display device 10 but may not be transmitted through the optical filter 3. For reference, the second external light 52'" that has transmitted through the optical reflectance conversion device 4 is a circularly polarized light that rotates in the same direction as the second external light 52'.

According to the current embodiment, since the second external light 52" that is reflected by the optical reflectance conversion device 4 cannot be transmitted through the optical filter 3, the second external light 52" may not reach the user located in a direction in which the image is emitted. Accordingly, the external light reflection is removed in the third mode in which the optical reflectance conversion device 4 is a semi-transparent, and thus, the contrast ratio of the display apparatus 100 is not reduced.

Figure 12:
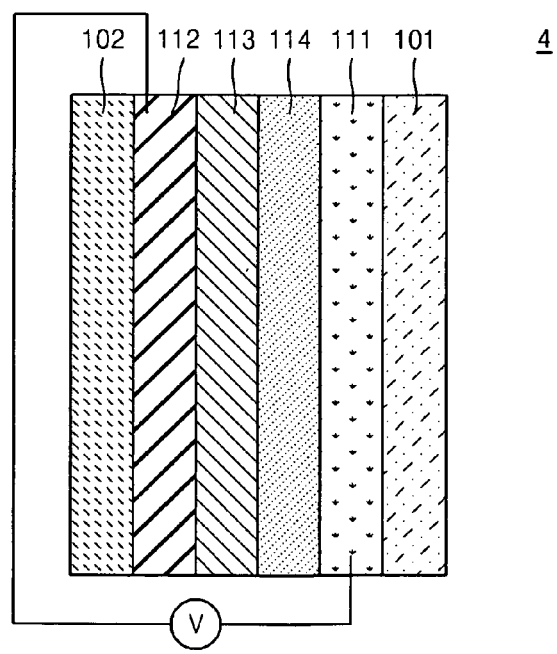
FIG. 12 is a schematic drawing showing an optical reflectance conversion device included in a display apparatus, according to an embodiment.

FIG. 12 is a schematic drawing showing an optical reflectance conversion device 4 included in a display apparatus 100, according to an embodiment. The optical reflectance conversion device 4 depicted in FIG. 12 is a kind of electro-chromic device. However, the optical reflectance conversion device 4 according present embodiments are not limited to the electro-chromic device depicted in FIG. 12 and may be electro-chromic devices having various structures.

Referring to FIG. 12, an aspect of the electro-chromic device is that the electro-chromic device includes a pair of transparent electrode layers 111 and 112 to which a power is applied, and an electro-chromic material layer 113 interposed between the pair of transparent electrode layers 111 and 112.

The transparent electrode layers 111 and 112 may be formed of a conductive material of ITO, IZO, ZnO, and $In_2O_3$. Substrates 101 and 102 may further be included on external sides of the transparent electrode layers 111 and 112, respectively.

The electro-chromic material layer 113 includes an electro-chromic material. When an electrical current or a voltage is applied to the electro-chromic material, the phase of the electro-chromic material is changed whereby the optical reflectance of the display apparatus 100 is controlled. For example, the electro-chromic material may be one of magnesium (Mg), nickel (Ni), palladium (Pd), aluminum (Al), tantalum pentoxide ($Ta_2O_5$), hexagonal hydrogen tungsten bronze ($HxWO_3$), tungsten oxide ($WO_3$), and nickel oxide (NiOxHy).

When a predetermined power is applied to the transparent electrode layers 111 and 112, the electro-chromic material of the electro-chromic device is changed from a transparent state to a mirror phase by reacting with ions or electrons in an electrolyte. For example, in a state that a first power is applied to the optical reflectance conversion device 4, the optical reflectance conversion device 4 is transparent. However, in a state that the second power is applied, the optical reflectance conversion device 4 shows metal reflection characteristics like an opaque mirror, and when the third power is applied, the optical reflectance conversion device 4 shows semitransparent mirror characteristics. The magnitude of the power and the degree of changing the reflectance of the optical reflectance conversion device 4 may be determined when a product is manufactured. The technology of manufacturing the optical reflectance conversion device 4 is well known in the art.

The configuration of the electro-chromic device is not limited thereto, and a catalyst layer that includes Pd, a buffer layer that includes Al, and an electrolyte layer that facilitates ion conduction of the electro-chromic material may further be formed as an additional layer 114 on the electro-chromic material layer 113. These layers can increase the electro-chromic efficiency or stabilize the electro-chromic device.

By way of summation and review, transparent display apparatuses have a fixed transmittance. Therefore, the transmittance of the transparent display apparatuses may not be controlled by a user, and may have a reduced contrast ratio due to reflection of external light. Even though the reflected light may be shielded by attaching an optical filter on a front surface of the transparent display apparatus, external light that enters from a rear surface of the display apparatus through the transparent region reduces the contrast ratio of the display apparatus. Therefore, there is a need to develop a display apparatus that can reduce the contrast ratio, and has transparency.

Embodiments are directed to a transparent display apparatus that can reduce the contrast ratio by disposing an optical filter and an optical reflectance conversion device in each operation mode of the transparent display device, and a method of operating the transparent display apparatus.

Exemplary embodiments have been disclosed herein, and although specific terms are employed, they are used and are to be interpreted in a generic and descriptive sense only and not for purpose of limitation.

What is claimed is:

1. A display apparatus, comprising:
   a first substrate including a pixel region and a transmitting region adjacent to the pixel region defined thereon, the pixel region including pixels and emitting light in a first direction and the transmitting region transmitting external light;
   a second substrate that faces the first substrate and seals pixels defined on the first substrate;
   an optical filter arranged on a first side of the display apparatus through which light is emitted, the optical filter being configured to transmit circularly polarized light that rotates in a predetermined direction; and
   an optical reflectance conversion device arranged on a second side of the display apparatus, opposite the first side, the optical reflectance conversion device being configured to change a reflectance of the external light according to modes of operation of the display apparatus, wherein a pixel of the pixels includes:
- a pixel circuit unit in the pixel region on the first substrate, the pixel circuit unit including at least one thin-film transistor,
- a first electrode electrically connected to the pixel circuit unit,
- a second electrode facing the first electrode,
- an organic film between the first electrode and the second electrode, and
- a pixel define layer between peripheral portions of the first and second electrodes, the pixel circuit, the first electrode, the second electrode, the organic film, and the pixel define layer being located only in the pixel region among the pixel and transmitting regions.

2. The display apparatus as claimed in claim 1, wherein the pixel of the pixels further includes:
- a first insulating film covering at least the pixel circuit unit;
- the first electrode on the first insulating film and not overlapping the pixel circuit unit, and the first electrode is formed of a transparent conductive material;
- the second electrode configured to reflect light emitted in a direction towards the first electrode; and
- the organic film including a light-emitting layer.

3. The display apparatus as claimed in claim 2, wherein the optical filter is on an outer side of the first substrate and the optical reflectance conversion device is on an outer side of the second substrate.

4. The display apparatus as claimed in claim 2, wherein the pixel includes the transmitting region and a plurality of the pixel regions separated from each other by interposing the transmitting region therebetween.

5. The display apparatus as claimed in claim 2, wherein the pixel define layer does not cover some of the first electrode, and the organic film is located on a portion of the first electrode that is not covered by the pixel define layer.

6. The display apparatus as claimed in claim 1, wherein the pixel of the pixels further includes:
- a first insulating film covering at least the pixel circuit unit;
- the first electrode on the first insulating film and overlapping with the pixel circuit unit, and the first electrode includes a conductive material reflection;
- the second electrode configured to reflect light to be emitted in a direction opposite to the first electrode; and
- the organic film including a light-emitting layer.

7. The display apparatus as claimed in claim 6, wherein the optical filter is on an outer side of the second substrate and the optical reflectance conversion device is on an outer side of the first substrate.

8. The display apparatus as claimed in claim 6, wherein the pixel includes the transmitting region and a plurality of the pixel regions separated from each other by interposing the transmitting region.

9. The display apparatus as claimed in claim 6, wherein the pixel define layer does not cover some of the first electrode, and the organic film is located on a portion of the first electrode that is not covered by the pixel define layer.

10. The display apparatus as claimed in claim 1, wherein the optical filter is a combination of a linear polarizing filter and a Lambda/4 retarder or a circularly polarizing filter.

11. The display apparatus as claimed in claim 1, wherein the optical reflectance conversion device has a limitation that a sum of the reflectance of the external light and a transmittance of the external light is one.

12. The display apparatus as claimed in claim 1, wherein the optical reflectance conversion device is a liquid crystal device or an electro-chromic device.

13. The display apparatus as claimed in claim 12, wherein the electro-chromic device includes:
- a pair of transparent electrode layers to which power is applied; and
- an electro-chromic material layer between the transparent electrode layers and including an electro-chromic material, a phase of which is changed by a power applied to the transparent electrode layers to control an optical reflectance of the display apparatus.

14. The display apparatus as claimed in claim 1, wherein, in a first mode, the optical reflectance conversion device transmits the external light that enters through the optical filter and the display device.

15. The display apparatus as claimed in claim 1, wherein, in a second mode, the optical reflectance conversion device reflects the external light entering through the optical filter and the display device.

16. The display apparatus as claimed in claim 15, wherein, in the second mode, the external light that is reflected by the optical reflectance conversion device is not re-transmitted through the optical filter.

17. The display apparatus as claimed in claim 1, wherein, in a third mode, the optical reflectance conversion device reflects an external light portion of the external light entering through the optical filter and the display device and transmits the other external light portion of the external light.

18. The display apparatus as claimed in claim 17, wherein, in the third mode, the external light portion of the external light that is reflected by the optical reflectance conversion device is not re-transmitted through the optical filter.

19. A method of operating a display apparatus that includes a display device, an optical filter arranged on a first side of the display apparatus to which light is emitted, the optical filter being configured to transmit circularly polarized light that rotates in a predetermined direction, and an optical reflectance conversion arranged on a second side of the display apparatus, opposite the first side, the optical reflectance conversion device being configured to change a reflectance of the external light according to modes of operation of the display apparatus, the method comprising:
- realizing a first mode, a second mode, and a third mode by controlling the reflectance of the external light that is transmitted through the optical filter and the display device by applying different powers to the optical reflectance conversion device,
- wherein the display device includes a pixel region emitting light in a first direction and a transmitting region transmitting the external light through an entire thickness of the display device, the display device including at least one thin-film transistor, a first electrode electrically connected to the at least one thin-film transistor, a second electrode facing the first electrode, an organic film between the first electrode and the second electrode, and a pixel define layer between peripheral portions of the first and second electrodes only in the pixel region among the pixel and transmitting regions.

20. The method as claimed in claim 19, wherein realizing the first mode includes:
- applying a first power to the optical reflectance conversion device;
- displaying an image in the first direction in the display device; and transmitting the external light in a second direction, opposite the first direction, through the optical filter, the display device, and the optical reflectance conversion device.

21. The method as claimed in claim 19, wherein realizing the second mode includes:
   applying a second power to the optical reflectance conversion device;
   displaying an image in the first direction in the display device;
   transmitting the external light in a second direction, opposite the first direction, through the optical filter and the display device;
   reflecting the external light transmitted through the optical filter and the display device in the first direction by the optical reflectance conversion device; and
   transmitting reflected external light through the display device, but not through the optical filter.

22. The method as claimed in claim 19, wherein realizing the third mode includes:
   applying a third power to the optical reflectance conversion device;
   displaying an image in the first direction in the display device;
   transmitting the external light in a second direction, opposite to the first direction, through the optical filter and the display device;
   reflecting a first portion of the external light transmitted through the optical filter and the display device in the first direction by the optical reflectance conversion device and transmitting a second portion of the external light in the second direction through the optical reflectance conversion device; and
   transmitting reflected external light through the display device, but not through the optical filter.

* * * * *